United States Patent
Kachi et al.

(10) Patent No.: US 10,175,329 B2
(45) Date of Patent: Jan. 8, 2019

(54) MAGNETIC RESONANCE IMAGING APPARATUS AND MAGNETIC RESONANCE IMAGING METHOD FOR CORRECTING TRANSMISSION UNEVENNESS DUE TO RF PULSE

(71) Applicant: Toshiba Medical Systems Corporation, Otawara-shi (JP)

(72) Inventors: Junichi Kachi, Otawara (JP); Hiroshi Takai, Nasushiobara (JP); Yoshiteru Watanabe, Nasushiobara (JP); Yoshinari Morita, Utsunomiya (JP); Kazuya Tanoue, Utsunomiya (JP)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 1186 days.

(21) Appl. No.: 14/303,117

(22) Filed: Jun. 12, 2014

(65) Prior Publication Data

US 2014/0292335 A1 Oct. 2, 2014

Related U.S. Application Data

(63) Continuation of application No. PCT/JP2013/052512, filed on Feb. 4, 2013.

(30) Foreign Application Priority Data

Feb. 3, 2012 (JP) .................................. 2012-022153

(51) Int. Cl.
*G01R 33/565* (2006.01)
*G01R 33/24* (2006.01)
(Continued)

(52) U.S. Cl.
CPC ......... *G01R 33/565* (2013.01); *G01R 33/246* (2013.01); *G01R 33/5659* (2013.01); *G01R 33/5608* (2013.01); *G01R 33/5611* (2013.01)

(58) Field of Classification Search
USPC ......................... 324/300–322; 600/407–435; 382/128–131
See application file for complete search history.

(56) References Cited

U.S. PATENT DOCUMENTS

| | | | |
|---|---|---|---|
| 8,111,070 B2 | 2/2012 | Adachi et al. | 324/309 |
| 8,217,652 B2 | 7/2012 | Dannels | 324/309 |

(Continued)

FOREIGN PATENT DOCUMENTS

| | | |
|---|---|---|
| JP | 7-222724 | 8/1995 |
| JP | 2007-236624 | 9/2007 |

(Continued)

*Primary Examiner* — Melissa Koval
*Assistant Examiner* — Tiffany Fetzner
(74) *Attorney, Agent, or Firm* — Nixon & Vanderhye P.C.

(57) ABSTRACT

A magnetic resonance imaging apparatus according to an embodiment includes: an obtaining unit, a correction coefficient deriving unit, an amplification degree deriving unit, and a filtering processing unit. The obtaining unit obtains a distribution of a radio frequency magnetic field. The correction coefficient deriving unit derives, on a basis of the distribution of the radio frequency magnetic field, a transmission correction coefficient used for correcting a transmission unevenness. The amplification degree deriving unit derives, for each of pixels, an amplification degree by which noise components are amplified in the image due to the correction, on the basis of either the distribution of the radio frequency magnetic field or the transmission correction coefficient. The filtering processing unit performs a filtering process according to the amplification degree on each of the pixels in the image to which the correction is applied.

15 Claims, 6 Drawing Sheets

(51) Int. Cl.
 *G01R 33/561* (2006.01)
 *G01R 33/56* (2006.01)

(56) References Cited

U.S. PATENT DOCUMENTS

| | | | | |
|---|---|---|---|---|
| 8,405,395 B2* | 3/2013 | Setsompop | ........ | G01R 33/4835 |
| | | | | 324/309 |
| 9,285,449 B2* | 3/2016 | Liu | ........ | G01R 33/443 |
| 9,778,338 B2* | 10/2017 | Setsompop | ........ | G01R 33/4835 |
| 2007/0198203 A1 | 8/2007 | Kimura | ........ | 702/85 |
| 2007/0210794 A1 | 9/2007 | Kabasawa | ........ | 324/309 |
| 2008/0129298 A1* | 6/2008 | Vaughan | ........ | G01R 33/5612 |
| | | | | 324/322 |
| 2009/0285463 A1* | 11/2009 | Otazo | ........ | G06T 3/4053 |
| | | | | 382/131 |
| 2011/0254548 A1* | 10/2011 | Setsompop | ........ | G01R 33/4835 |
| | | | | 324/309 |
| 2012/0321162 A1* | 12/2012 | Liu | ........ | G01R 33/443 |
| | | | | 382/131 |
| 2013/0181710 A1* | 7/2013 | Setsompop | ........ | G01R 33/4835 |
| | | | | 324/309 |
| 2014/0292335 A1* | 10/2014 | Kachi | ........ | G01R 33/246 |
| | | | | 324/309 |

FOREIGN PATENT DOCUMENTS

| | | |
|---|---|---|
| JP | 2007-244848 | 9/2007 |
| JP | 2010-029640 | 2/2010 |
| JP | 2010-142411 | 7/2010 |

* cited by examiner

MAGNETIC RESONANCE IMAGING APPARATUS AND MAGNETIC RESONANCE IMAGING METHOD FOR CORRECTING TRANSMISSION UNEVENNESS DUE TO RF PULSE

CROSS-REFERENCE TO RELATED APPLICATIONS

This application is a continuation of PCT international application Ser. No. PCT/JP2013/052512 filed on Feb. 4, 2013 which designates the United States, incorporated herein by reference, and which claims the benefit of priority from Japanese Patent Application No. 2012-022153, filed on Feb. 3, 2012, the entire contents of which are incorporated herein by reference.

FIELD

Embodiments described herein relate generally to a magnetic resonance imaging apparatus and a magnetic resonance imaging method.

BACKGROUND

In recent years, as magnetic resonance imaging apparatuses (hereinafter, "MRI apparatuses", as necessary) have been developed so as to have a strong magnetic field, 3 tesla ("3T") MRI apparatuses, for example, have become popular. 3T MRI apparatuses have a higher resonance frequency and a shorter Radio Frequency (RF) pulse wavelength to be transmitted than 1.5T MRI apparatuses. As a result, inhomogeneity is caused because, for example, the RF pulse having a shorter wavelength attenuates inside an examined subject (hereinafter, a "subject"). Due to this inhomogeneity, a phenomenon occurs to a significant extent where echo signals also become inhomogeneous. This phenomenon is referred to as inhomogeneity of a radio frequency magnetic field (hereinafter, a "B1 magnetic field", as necessary).

Conventionally, as a method for reducing the inhomogeneity of a B1 magnetic field, a method using B1 shimming, for example, has been proposed by which an RF pulse is transmitted after the amplitude thereof and/or the phase thereof are corrected.

DETAILED DESCRIPTION

A magnetic resonance imaging apparatus according to an embodiment includes: an obtaining unit, a correction coefficient deriving unit, an amplification degree deriving unit, and a filtering processing unit. The obtaining unit obtains a distribution of a radio frequency magnetic field. The correction coefficient deriving unit derives, on a basis of the distribution of the radio frequency magnetic field, a transmission correction coefficient used for correcting a transmission unevenness that occurs in an image due to a transmission of an RF pulse. The amplification degree deriving unit derives, for each of pixels, an amplification degree by which noise components are amplified in the image due to the correction, on the basis of either the distribution of the radio frequency magnetic field or the transmission correction coefficient. The filtering Processing unit performs a filtering process according to the amplification degree on each of the pixels in the image to which the correction is applied.

In the following sections, exemplary embodiments of a magnetic resonance imaging apparatus and a magnetic resonance imaging method will be explained, with reference to the accompanying drawings.

Figure 1:
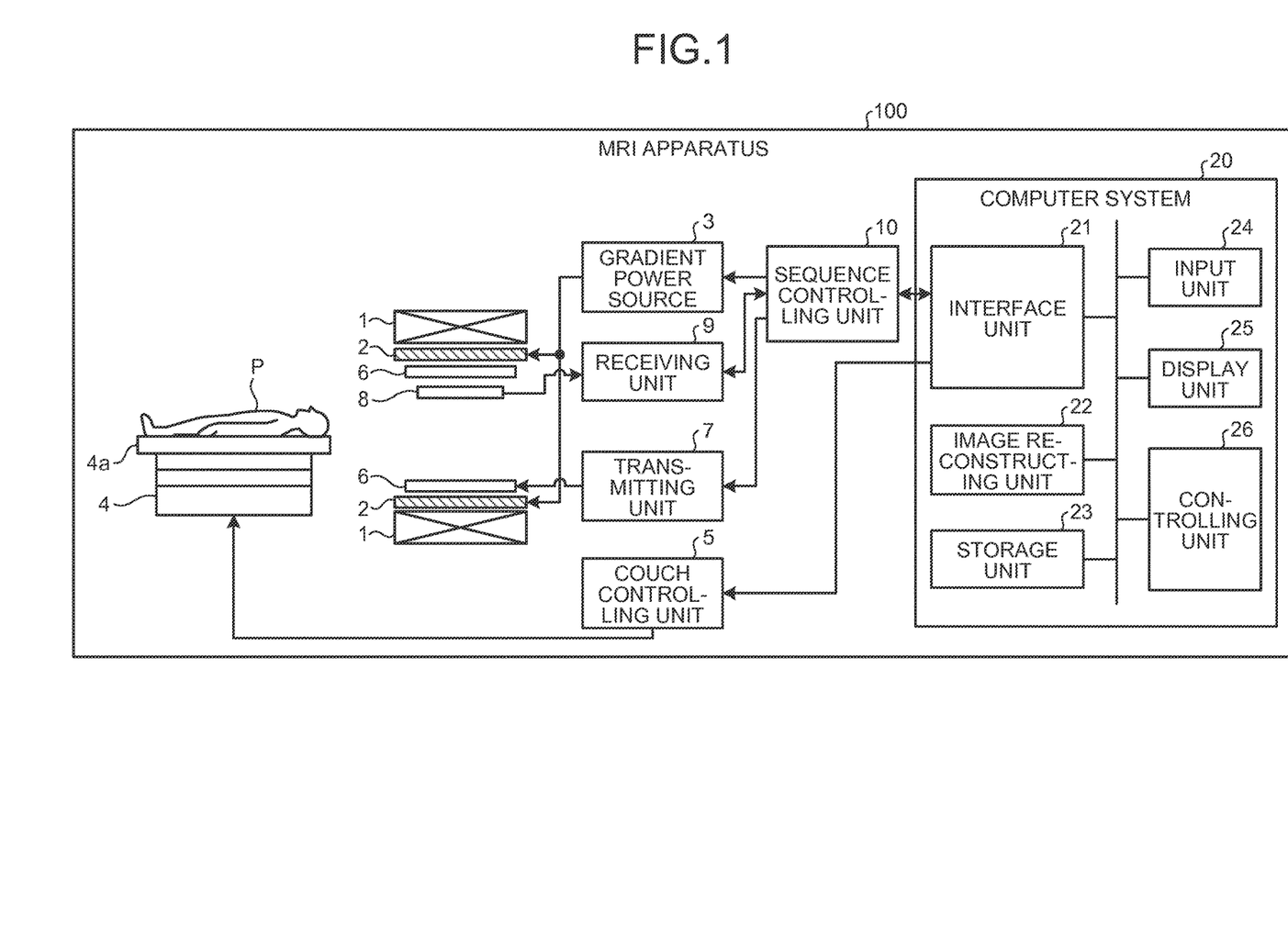
FIG. 1 is a block diagram of an MRI apparatus according to an embodiment.

FIG. 1 is a block diagram of an MRI apparatus 100 according to an embodiment. The MRI apparatus 100 does not include an examined subject (hereinafter, a "subject") P. A magnetostatic field magnet 1 is formed in the shape of a hollow circular cylinder and generates a uniform magnetostatic field in the space on the inside thereof. The magnetostatic field magnet 1 may be configured by using, for example, a permanent magnet or a superconductive magnet. A gradient coil 2 is formed in the shape of a hollow circular cylinder and generates a gradient magnetic field in the space on the inside thereof. More specifically, the gradient coil 2 is disposed on the inside of the magnetostatic field magnet 1 and generates the gradient magnetic field by receiving a supply of a gradient pulse from a gradient power source 3 According to a control signal transmitted from a sequence controlling unit 10, the gradient power source 3 supplies the gradient pulse to the gradient coil 2.

A couch 4 includes a couchtop 4a on which the subject P is placed. While the subject P is placed thereon, the couchtop 4a is inserted into the hollow, which is an image taking opening, of the gradient coil 2. Normally, the couch 4 is provided so that the longitudinal direction thereof extends parallel to the central axis of the magnetostatic field magnet 1. A couch controlling unit 5 drives the couch 4 so that the couchtop 4a moves in the longitudinal direction and in an up-and-down direction.

A transmission coil 6 is configured to generate a B1 magnetic field. More specifically, the transmission coil 6 is a Radio Frequency (RF) coil disposed on the inside of the gradient coil 2 and generates the B1 magnetic field by receiving a supply of an RF pulse from a transmitting unit 7 For example, the transmission coil 6 is a Whole Body Coil (WBC). According to a control signal transmitted from the sequence controlling unit 10, the transmitting unit 7 supplies the RF pulse corresponding to a Larmor frequency to the transmission coil 6.

A receiving coil 8 is configured to receive magnetic resonance signals (hereinafter, "MR signals"). More specifically, the receiving coil 8 is an RF coil disposed on the inside of the gradient coil 2 and receives the MR signals emitted from the subject P due to an influence of the magnetic field. Further, the receiving coil 8 outputs the received MR signals to a receiving unit 9. For example, the receiving coil is a WBC or an Arrayed Coil (AC).

According to a control signal transmitted from the sequence controlling unit 10, the receiving unit 9 generates MR signal data on the basis of the MR signals being output from the receiving coil 8. More specifically, the receiving unit 9 generates the MR signal data by applying a digital conversion to the MR signals being output from the receiving coil 8 and further transmits the generated MR signal data to a computer system 20 via the sequence controlling unit 10. The receiving unit 9 may be provided on a gantry device side where the magnetostatic field magnet 1, the gradient coil 2, and like are provided.

The sequence controlling unit 10 is configured to control the gradient power source 3, the transmitting unit 7, and the receiving unit 9. More specifically, the sequence controlling unit 10 transmits the control signals based on pulse sequence execution data transmitted from the computer system 20, to the gradient power source 3, to the transmitting unit 7, and to the receiving unit 9. For example, the sequence controlling unit 10 is configured by using an integrated circuit such as an Application Specific Integrated Circuit (ASIC) or a Field Programmable Gate Array (FPGA), or an electronic circuit such as a Central Processing Unit (CPU) or a Micro Processing Unit (MPU).

The computer system 20 includes an interface unit 21, an image reconstructing unit 22, a storage unit 23, an input unit 24, a display unit 25, and a controlling unit 26. The interface unit 21 is connected to the sequence controlling unit 10 and is configured to control inputs and outputs of data that is transmitted and received between the sequence controlling unit 10 and the computer system 20.

The image reconstructing unit 22 is configured to reconstruct an image from the MR signal data transmitted from the sequence controlling unit 10 and to store the reconstructed image into the storage unit 23. For example, the image reconstructing unit 22 is configured by using an integrated circuit such as an ASIC or an FPGA, or an electronic circuit such as a CPU or an MPU.

The storage unit 23 stores therein the image stored therein by the image reconstructing unit 22 and other data used by the MRI apparatus 100. For example, the storage unit 23 is configured by using a semiconductor memory element such as a Random Access Memory (RAM) or a flash memory, a hard disk, an optical disk, or the like.

The input unit 24 is configured to receive various types of instructions from an operator. For example, the input unit 24 is configured by using a mouse and/or a keyboard. The display unit 25 is configured to display an image and the like. The display unit 25 is configured by using, for example, a liquid crystal display device or the like.

The controlling unit 26 is configured to comprehensively control the MRI apparatus 100, by controlling the functional units described above. For example, the controlling unit 26 is configured by using an integrated circuit such as an ASIC or an FPGA, or an electronic circuit such as a CPU or an MPU.

As explained later, the MRI apparatus 100 according to the present embodiment is configured to reduce inhomogeneity in brightness levels among the MR signals, by estimating a B1 magnetic field distribution and performing a brightness correcting process while using correction coefficients derived from the estimated B1 magnetic field distribution. It should be noted that, however, when such a brightness correcting process is performed, in regions where the intensity of the B1 magnetic field is low and the brightness levels are low, the brightness levels of noise components in the background are also raised together with those of the image. As a result, sharpness of the image becomes inhomogeneous, which makes it difficult to view the image. To cope with this situation, the MRI apparatus 100 according to the present embodiment reduces inhomogeneity in sharpness by properly selecting filters to be applied to the image, on the basis of information obtained from the B1 magnetic field distribution.

Figure 2:
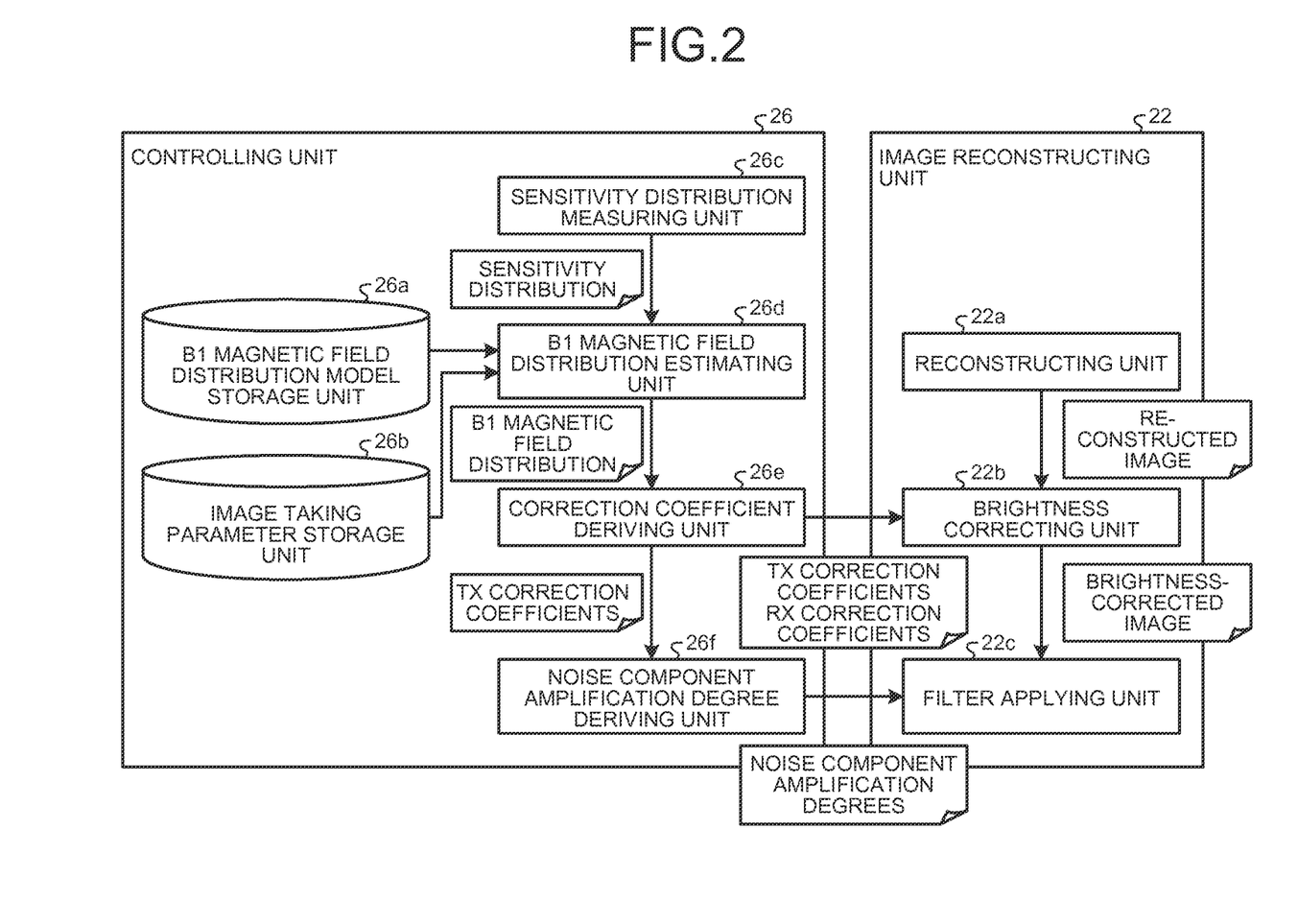
FIG. 2 is a block diagram of a controlling unit and an image reconstructing unit according to the embodiment.

FIG. 2 is a block diagram of the controlling unit 26 and the image reconstructing unit 22 according to the present embodiment.

The controlling unit 26 includes a B1 magnetic field distribution model storage unit 26a and an imaging parameter storage unit 26b. Further, the controlling unit 26 includes a sensitivity distribution measuring unit 26c, a B1 magnetic field distribution estimating unit 26d (which may be referred to as an "estimating unit" or an "obtaining unit"), a correction coefficient deriving unit 26e, and a noise component amplification degree deriving unit 26f (which may be referred to as an "amplification degree deriving unit").

The B1 magnetic field distribution model storage unit 26a stores therein a B1 magnetic field distribution model used for estimating the B1 magnetic field distribution. The B1 magnetic field distribution model stored in the B1 magnetic field distribution model storage unit 26a is used in a process performed by the B1 magnetic field distribution estimating unit 26d.

In the present embodiment, the B1 magnetic field distribution model is realized as a model by assigning the brightness levels of the MR signals to a three-dimensional geometric shape. For example, the B1 magnetic field distribution model is defined by using a closed mathematical function that has a spatial dependency and fluctuates smoothly, so as to fit a Gaussian distribution shape. Further, because it is possible to roughly speculate a B1 magnetic field distribution of each image taking site on the basis of the shape, the size, and the magnetic susceptibility thereof, a B1 magnetic field distribution is prepared in advance for each of different sites (e.g., the head, the cervical vertebrae, the abdomen, the spine, the pelvis, and so on).

Figure 3:
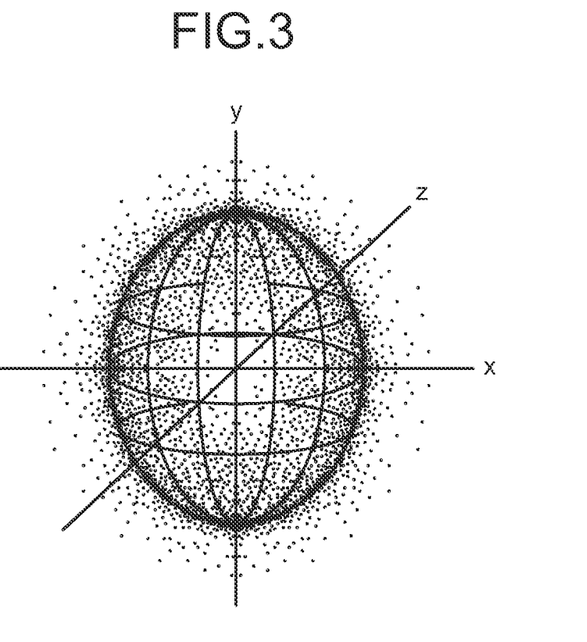
FIG. 3 is a drawing of a head model according to the embodiment.
Figure 4:
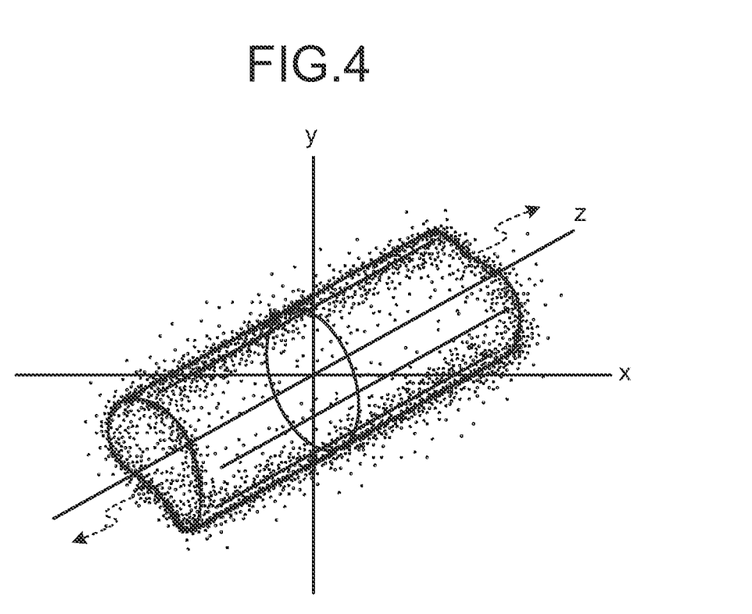
FIG. 4 is a drawing of an abdomen model according to the embodiment.

FIG. 3 is a drawing of a head model according to the present embodiment, whereas FIG. 4 is a drawing of an abdomen model according to the present embodiment. As shown in FIG. 3, a B1 magnetic field model of the "head" is realized as a model while taking the shape of a three-dimensional sphere, for example. As shown in FIG. 4, a B1 magnetic field model of the "abdomen" is realized as a model while taking the shape of a three-dimensional circular cylinder, for example.

The imaging parameter storage unit 26b stores therein imaging parameters used in a sensitivity map taking process performed by the sensitivity distribution measuring unit 26c, as well as other imaging parameters used in a main imaging process during which one or more images for diagnosis purposes are taken. The imaging parameters stored in the imaging parameter storage unit 26b are used in a process performed by the B1 magnetic field distribution estimating unit 26d. For example, the imaging parameter storage unit 26b stores therein imaging parameters such as a Repetition Time (TR) and an Echo Time (TE), as well as the type of the imaging process (e.g., T1-weighted, T2-weighted, or the like).

The sensitivity distribution measuring unit 26c is configured to measure a sensitivity distribution of the RF coil and to transmit the measured sensitivity distribution to the B1 magnetic field distribution, estimating unit 26d and the correction coefficient deriving unit 26e. In this situation, the sensitivity distribution is a spatial distribution of sensitivity levels, i.e., a spatial distribution of brightness levels of the MR signals.

In the present embodiment, while the couchtop 4a on which the subject P is placed is in an inserted position in the hollow of the gradient coil 2, the sensitivity distribution measuring unit 26c measures the sensitivity distribution of the RF coil, by performing the sensitivity map taking process as a prior imaging process that precedes the main imaging process. For example, the sensitivity distribution measuring unit 26c measures the sensitivity distribution by acquiring an image having a relatively low resolution (e.g., TR: 200 milliseconds; TE: 2 to 4 milliseconds; the flip angle: 20° to 40°; the spatial resolution: approximately 1 centimeter; and the number of slices: 20 to 45) while using a Field Echo (FE) sequence. The sensitivity distribution measuring process performed by the sensitivity distribution measuring unit 26c is not limited to the example described above and may be realized by using any publicly-known technique.

Further, in the present embodiment, the sensitivity distribution measuring unit 26c performs the sensitivity map taking process in two patterns. In one pattern, a WBC is employed as an RF coil (the transmission coil 6) for transmitting the RF pulse, and a WBC is employed as an RF coil (the receiving coil 8) for receiving the MR signals. A sensitivity distribution measured by using this pattern will be hereinafter referred to as a "WBC-WBC sensitivity map", as necessary. In the other pattern, a WBC is employed as the transmission coil 6, whereas an AC is used as the receiving coil 8. A sensitivity distribution measured by using this pattern will be hereinafter referred to as a "WBC-AC sensitivity map", as necessary. For example, the sensitivity distribution measuring unit 26c performs a sensitivity map taking process by repeating the former pattern and the latter pattern in correspondence with TRs.

The sensitivity distribution measured by the sensitivity distribution measuring unit 26c contains types of unevenness that are caused due to inhomogeneity of the B1 magnetic field, i.e., both a "transmission unevenness" that is caused in the image due to the transmission of the RF pulse and a "receiving unevenness" that is caused in the image due to the reception of the MR signals.

In the past when MRI apparatuses had not yet been developed so as to have a strong magnetic field, it was assumed that WBCs rarely have a "transmission unevenness". Thus, to cope with the "receiving unevenness", it had been common practice to perform a brightness correcting process on a target reconstructed image by using a sensitivity distribution measured by performing a sensitivity map taking process. Such a brightness correcting process is realized by a so-called calculation of reciprocals where brightness levels are raised for those pixels in spatial positions having low brightness levels in the sensitivity distribution and brightness levels are lowered for those pixels in spatial positions having high brightness levels in the sensitivity distribution.

However, because MRI apparatuses have been developed so as to have a strong magnetic field, the "transmission unevenness" of WBCs is no longer negligible, and we find ourselves in a situation where the brightness correcting process performed on the basis of a sensitivity distribution affected by the "transmission unevenness" is not able to properly correct the "receiving unevenness", either. As a technique for reducing the "transmission unevenness", a method using B1 shimming has conventionally been proposed by which an RF pulse is transmitted after the amplitude thereof and/or the phase thereof are corrected; however, in some situations, it is not necessarily possible to make a sufficient correction even by using such a method.

The B1 magnetic field distribution estimating unit 26d is configured to estimate a B1 magnetic field distribution on the basis of the sensitivity distribution measured by the sensitivity distribution measuring unit 26c and to transmit the estimated B1 magnetic field distribution to the correction coefficient deriving unit 26e. Further, in the present embodiment, the B1 magnetic field distribution estimating unit 26d is configured to estimate the B1 magnetic field distribution by arranging the B1 magnetic field distribution model stored in the B1 magnetic field distribution model storage unit 26a so as to fit the sensitivity distribution measured by the sensitivity distribution measuring unit 26c.

More specifically, the B1 magnetic field distribution estimating unit 26d first estimates a sensitivity distribution that contains both a "transmission unevenness" and a "receiving unevenness", by reading a B1 magnetic field distribution model of the image taking site from the B1 magnetic field distribution model storage unit 26a and arranging the read B1 magnetic field distribution model so as to fit the WBC-WBC sensitivity map measured by the sensitivity distribution measuring unit 26c. By implementing this method by which the B1 magnetic field distribution model is arranged to fit the sensitivity distribution that was actually measured, it is possible to facilitate the calculation processes and the like.

For example, the head model illustrated in FIG. 3 can be represented by Expression (1) shown below:

$$\text{The head model} = c1 + c2e^{-0.5[((x-c3)/c6)^2 + ((y-c4)/c7)^2 + ((z-c5)/c8)^2]} \quad (1)$$

The B1 magnetic field distribution estimating unit 26d conducts an optimization search for a head model that fits the WBC-WBC sensitivity map so as to optimize the parameters (e.g., c1, c2, c6, and c7) used in Expression (1). As a result, the B1 magnetic field distribution estimating unit 26d estimates a sensitivity distribution that contains both a "transmission unevenness" and a "receiving unevenness". In this situation, c3, c4, and c5 each represent a gravity point of the imaging region.

As another example, the abdomen model illustrated in FIG. 4 can be represented by Expression (2) shown below:

$$\text{The abdomen model} = c1 + c2e^{-0.5[((x-c3)/c6)^2 + ((y-c4)/c7)^2]} \quad (2)$$

The B1 magnetic field distribution estimating unit 26d conducts an optimization search for an abdomen model that fits the WBC-WBC sensitivity map so as to optimize the parameters (e.g., c1, c2, c6, and c7) used in Expression (2). As a result, the B1 magnetic field distribution estimating unit 26d estimates a sensitivity distribution that contains both a "transmission unevenness" and a "receiving unevenness".

After that, the B1 magnetic field distribution estimating unit 26d divides the estimated sensitivity distribution into a "transmission unevenness" distribution and a "receiving unevenness" distribution. In this situation, the B1 magnetic field distribution, estimating unit 26d uses an assumption that the "transmission unevenness" of the WBC and the "receiving unevenness" of the WBC have substantially the same distribution as each other. Further, the B1 magnetic field distribution estimating unit 26d adjusts the estimated sensitivity distribution by multiplying the estimated sensitivity distribution by a coefficient used for taking an impact of the imaging parameters into account. The imaging parameters are those used in the sensitivity map taking process performed by the sensitivity distribution measuring unit 26c and include, for example, a TE, a TR, and a flip angle. An impact of these imaging parameters is considered to be intrinsic to the signal values of the MR signals. By performing a simulation, it is possible to obtain a function of the signal values that uses the imaging parameters as variables. For example, it is possible to obtain, a coefficient that eliminates the impact of the imaging parameters. Thus, to improve the level of precision in the estimation of the sensitivity distribution, the B1 magnetic field distribution estimating unit 26d uses the coefficient that eliminates the impact of the imaging parameters. It should be noted, however, that the present embodiment is not limited to this example; it is also acceptable to use the sensitivity distribution before being multiplied by the coefficient as an estimated B1 magnetic field distribution.

The B1 magnetic field distribution estimating unit 26d is thus able to estimate the distribution of the "transmission unevenness", i.e., the B1 magnetic field distribution, on the basis of the WBC-WBC sensitivity map. In the present embodiment, the example was explained in which the B1 magnetic field distribution estimating unit 26d estimates the B1 magnetic field distribution by using the sensitivity distribution measured by the sensitivity distribution measuring unit 26c; however, the present embodiment is not limited to this example. It is acceptable to configure the B1 magnetic field distribution estimating unit 26d so as to, for example, obtain a B1 magnetic field distribution by using an image acquired by implementing an imaging method by which a B1 magnetic field distribution is represented as an image.

The correction coefficient deriving unit 26e is configured to derive a correction coefficient (hereinafter, a "TX correction coefficient", as necessary) used for correcting the "transmission unevenness" and a correction coefficient (hereinafter, an "RX correction coefficient", as necessary) used for correcting the "receiving unevenness" and to transmit the TX correction coefficient and the RX correction coefficient that were derived to a brightness correcting unit 22b and to the noise component amplification degree deriving unit 26f.

Figure 5:
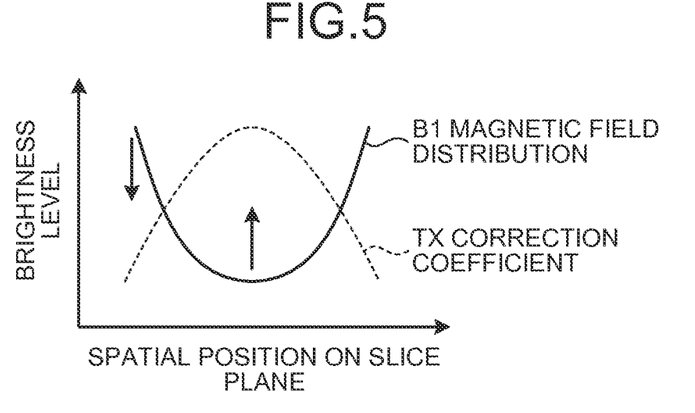
FIG. 5 is a drawing for explaining a correction coefficient according to the embodiment.

First, the correction coefficient deriving unit 26e derives the TX correction coefficient from the B1 magnetic field distribution estimated by the B1 magnetic field distribution estimating unit 26d. At this time, the correction coefficient deriving unit 26e multiplies the estimated B1 magnetic field distribution by a coefficient used for taking the impact of the imaging parameters into account. The imaging parameters are those used in the main imaging process and include, for example, a TE, a TR, and a flip angle. The present embodiment, however, is not limited to this example. It is acceptable to use the B1 magnetic field distribution before being multiplied by the coefficient. FIG. 5 is a drawing for explaining one of the correction coefficients according to the present embodiment. As shown in FIG. 5, the TX correction coefficient is derived so as to realize a so-called calculation of reciprocals where brightness levels are raised for those pixels in spatial positions of weak B1 magnetic fields having low brightness levels in the B1 magnetic field distribution and brightness levels are lowered for those pixels in spatial positions of strong B1 magnetic fields having high brightness levels in the B1 magnetic field distribution.

Further, the correction coefficient deriving unit 26e derives the RX correction coefficient by using the TX correction coefficient, the WBC-WBC sensitivity map, and the WBC-AC sensitivity map. The WBC-WBC sensitivity map contains the transmission unevenness of the WBCs. For example, this situation can be expressed as "the WBC-WBC sensitivity map containing the transmission unevenness=a WBC-WBC sensitivity map containing no transmission unevenness×the transmission unevenness". The correction coefficient deriving unit 26e derives the RX correction coefficient by dividing the WBC-WBC sensitivity map containing the transmission unevenness by "the WBC-AC sensitivity map×the B1 magnetic field distribution estimated by the B1 magnetic field distribution estimating unit 26d" and calculating a reciprocal thereof.

In other words, in this division, the "transmission unevenness" in the numerator and the "B1 magnetic field distribution estimated by the B1 magnetic field distribution estimating unit 26d" in the denominator cancel each other. Thus, the calculation is equivalent to dividing the WBC-WBC sensitivity map containing no transmission unevenness by the WBC-AC sensitivity map. In other words, the impact of the transmission unevenness is eliminated by the dividing by the "B1 magnetic field distribution estimated by the B1 magnetic field distribution estimating unit 26d". In this situation, the dividing by the "B1 magnetic field distribution estimated by the B1 magnetic field distribution estimating unit 26d" is equivalent to a multiplication by the TX correction coefficient derived by the correction coefficient deriving unit 26e. Thus, the RX correction coefficient is derived as a value equal to the value obtained by dividing the WBC-AC sensitivity map by the WBC-WBC sensitivity map containing no transmission unevenness. In this situation, it is assumed that the unevenness contained in the WBC-AC sensitivity map is so little that the unevenness is negligible.

On the basis of the TX correction coefficient, the noise component amplification degree deriving unit 26f is configured to derive, for each of the pixels, an amplification degree by which noise components are amplified (hereinafter, a "noise component amplification degree", as necessary) in the image due to the brightness correcting process and to transmit the derived noise component amplification degree to a filter applying unit 22c. More specifically, the noise component amplification degree deriving unit 26f derives the noise component amplification degree from the TX correction coefficient derived by the correction coefficient deriving unit 26e.

Figure 6:
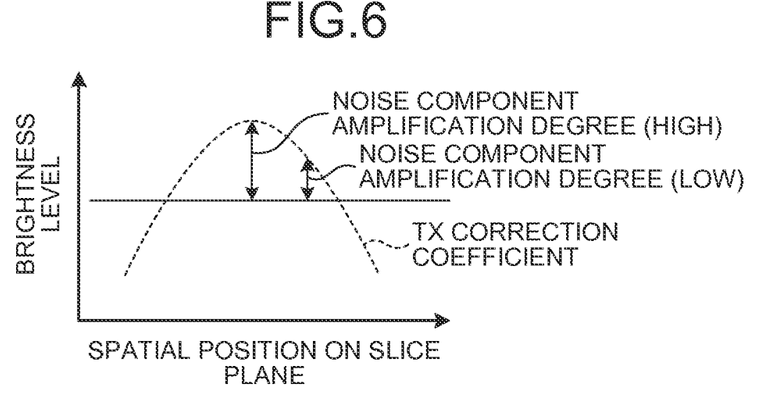
FIG. 6 is a drawing for explaining noise component amplification degrees according to the embodiment.

FIG. 6 is a drawing for explaining the noise component amplification degrees according to the present embodiment. As shown in FIG. 6, the noise component amplification degree is higher for pixels in such spatial positions where the value of the TX correction coefficient is larger, i.e., where a major correction is required, whereas the noise component amplification degree is lower for pixels in such spatial positions where the value of the TX correction coefficient is smaller, i.e., where a relatively minor correction is required.

Although FIG. 6 illustrates the example in which the noise component amplification degrees are calculated on the basis of the TX correction coefficients, the present embodiment is not limited to this example. It is also acceptable to derive noise component amplification degrees from the B1 magnetic field distribution, which is in the relationship of reciprocals with the TX correction coefficients.

Returning to the description of FIG. 2, the image reconstruct in unit 22 includes a reconstructing unit 22a, the brightness correcting unit 22b, and the filter applying unit 22c (which may be referred to as an "applying unit" or a "filtering processing unit").

The reconstructing unit 22a is configured to reconstruct an image from the MR signal data transmitted from the sequence controlling unit 10 and to transmit the reconstructed image to the brightness correcting unit 22b. In this situation, the MR signal data is the one acquired by performing the main imaging process.

The brightness correcting unit 22b is configured to perform brightness correcting processes on the image reconstructed by the reconstructing unit 22a while using the TX correction coefficients and the RX correction coefficients derived by the correction coefficient deriving unit 26e and to transmit the brightness-corrected image to the filter applying unit 22c.

More specifically, when having received the reconstructed image from the reconstructing unit 22a, the brightness correcting unit 22b performs a brightness correcting process on the image while using the TX correction coefficients and also performs a brightness correcting process on the image while using the RX correction coefficients. Further, the brightness correcting unit 22b multiplies the two images obtained as a result of the two brightness correcting processes by each other.

As mentioned above, in recent years, because MRI apparatuses have been developed so as to have a strong magnetic field, the "transmission unevenness" of WBCs is no longer negligible, and we find ourselves in a situation where the brightness correcting process performed on the basis of a sensitivity distribution affected by the "transmission unevenness" is not able to properly correct the "receiving unevenness", either. In this regard, the MRI apparatus 100 according to the present embodiment is configured to reduce the inhomogeneity in the brightness levels among the MR signals, by estimating the B1 magnetic field distribution on the basis of the sensitivity distribution, deriving the TX correction coefficients from the estimated B1 magnetic field distribution, deriving the RX correction coefficients that eliminate the impact of the transmission unevenness while using the TX correction coefficients, and performing the brightness correcting process while using each of the correction coefficients.

The filter applying unit 22c is configured to select, for each of the pixels, a filter to be applied to the brightness-corrected image in accordance with the noise component amplification degree and to apply the selected filter to each of the pixels in the brightness-corrected image. More specifically, when having received the brightness-corrected image from the brightness correcting unit 22b, the filter applying unit 22c selects the filter for each of the pixels, by using each of the noise component amplification degrees derived by the noise component amplification degree deriving unit 26f.

For example, the filter applying unit 22c is configured to select the filters in such a manner that the higher the noise component amplification degree of a target pixel is, the higher is the tendency for a selected filter (hereinafter, a "low-pass filter", as necessary) to pass relatively low frequency bandwidths and in such a manner that the lower the noise component amplification degree of a target pixel is, the higher is the tendency for a selected, filter (hereinafter, a "high-pass filter", as necessary) to pass relatively high frequency bandwidths.

Further, the filter applying unit 22c applies a selected filter to each of the target pixels. When having finished applying a filter to each of all the pixels in the image, the filter applying unit 22c performs a weighted addition on the image before the application of the filters and the image after the application of the filters, so as to obtain a final image. As a result of applying the low-pass filters to the regions having higher noise component amplification degrees, the noise components are suppressed. On the contrary, as a result of applying the high-pass filters to the regions having lower noise component amplification degrees, sharpness of the image is improved.

Next, the filter selecting process performed by the filter applying unit 22c will be explained in detail. It is acceptable to use any arbitrary filters as the filters. The specific example below is presented merely for purposes of illustration.

For example, as a smoothing filter, the filter applying unit 22c uses a nine-point filter that has coefficients shown in Expression (3) below:

$$\frac{1}{4}\begin{pmatrix} 0.25 & 0.5 & 0.25 \\ 0.5 & 1 & 0.5 \\ 0.25 & 0.5 & 0.25 \end{pmatrix} \quad (3)$$

After that, as shown in Expression (4) below, the filter applying unit 22c selects a filter by employing an adaptive filter $V(\beta)$ that uses a filter of which only the center component is 1 and a smoothing filter while applying weights thereto and by changing the weights in accordance with the noise component amplification degrees. The adaptive filter $V(\beta)$ is a filter that makes a continuous transition from smoothing to an edge enhancement.

$$(1-\beta)*\begin{pmatrix} 0 & 0 & 0 \\ 0 & 1 & 0 \\ 0 & 0 & 0 \end{pmatrix} + \beta*\frac{1}{4}\begin{pmatrix} 0.25 & 0.5 & 0.25 \\ 0.5 & 1 & 0.5 \\ 0.25 & 0.25 & 0.25 \end{pmatrix} = \begin{pmatrix} \beta_2 & \beta_1 & \beta_2 \\ \beta_1 & \beta_0 & \beta_1 \\ \beta_2 & \beta_1 & \beta_2 \end{pmatrix} \quad (4)$$

In other words, in Expression (4), the applied weights are dependent on the variable $\beta$. Thus, the filter applying unit 22c derives the variable $\beta$ from the noise component amplification degree. The variable $\beta$ has a value ranging from "−2" to "1" that serves as a weighting coefficient for the filter. The center component $\beta_0$ satisfies $\beta_0=1-(\frac{3}{4})*\beta$, whereas each of the components positioned above, below, on the left of, and on the right of the center satisfies $\beta_1=\beta/8$, while each of the components in a diagonal position from the center satisfies $\beta_2=\beta/16$.

First, the filter applying unit 22c defines a variable $\gamma$ by using Expression (5) shown below. The variable $\gamma$ is an LH coefficient that expresses the degree of the low-pass filter or the high-pass filter with a numerical value ranging from "−1" to "1". A variable NA is the noise component amplification degree. Thus, the variable $\gamma$ is expressed using the logarithm of the noise component amplification degree.

$$\gamma = \%~TX*((C_0*\log(NA))+C_1) \quad (5)$$

In Expression (5), the variable % TX is a parameter expressing the degree of the brightness correcting process performed by using the TX correction coefficient and reflects a preference of the user such as a level of brightness correcting process the user wishes to realize with the use of the TX correction coefficient. The variable $C_0$ is a parameter used for adjusting characteristics of the adaptive filter V and expresses a degree by which inhomogeneous property related to the sharpness of the image is to be reduced. The variable $C_0$ reflects a preference of the user such as the level of homogeneous property the user wishes to have. The variable $C_1$ is a parameter used for adjusting characteristics of the adaptive filter V and is a parameter used for adjusting the image quality of the corrected image. The variable $C_1$ reflects a preference of the user such as whether the image should be smoothed or whether the edges of the image should be enhanced. The variables % TX, $C_0$, and $C_1$ are parameters that can be adjusted by the user. For example, the user is able to change the values of these parameters in accordance with adjustments of a window level that are made to an image displayed on the display unit 25.

The variable γ is truncated to a numerical value ranging from "−1" to "1" by using Expression (6) shown below.

$$\gamma = \max(\min(\gamma, 1), -1) \quad (6)$$

The variable β, which is the weighting coefficient for the filter, is calculated by assigning the variable γ calculated in this manner to Expression (7) shown below:
<Mathematical Formula 7>

$$\beta = -0.5*\gamma^2 + 1.5*\gamma \quad (7)$$

By using Expression (7), an adjustment is made so that the effect of applying the filter is at approximately equal levels in the positive and the negative directions (the smoothing or the edge enhancement process). More specifically, if the variable γ is "−1", the variable β is "−2", whereas if the variable γ is "1", the variable β is "1", and if the variable γ is "0", the variable β is "0".

Figure 7:
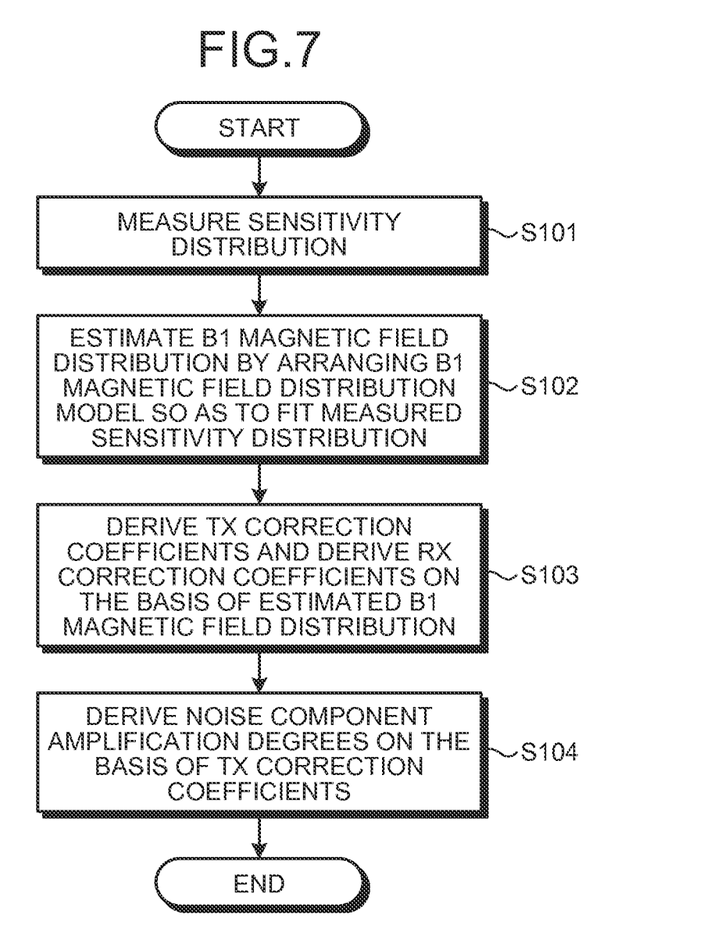
FIG. 7 is a flowchart of a processing procedure up to a process of deriving the noise component amplification degrees according to the embodiment.
Figure 8:
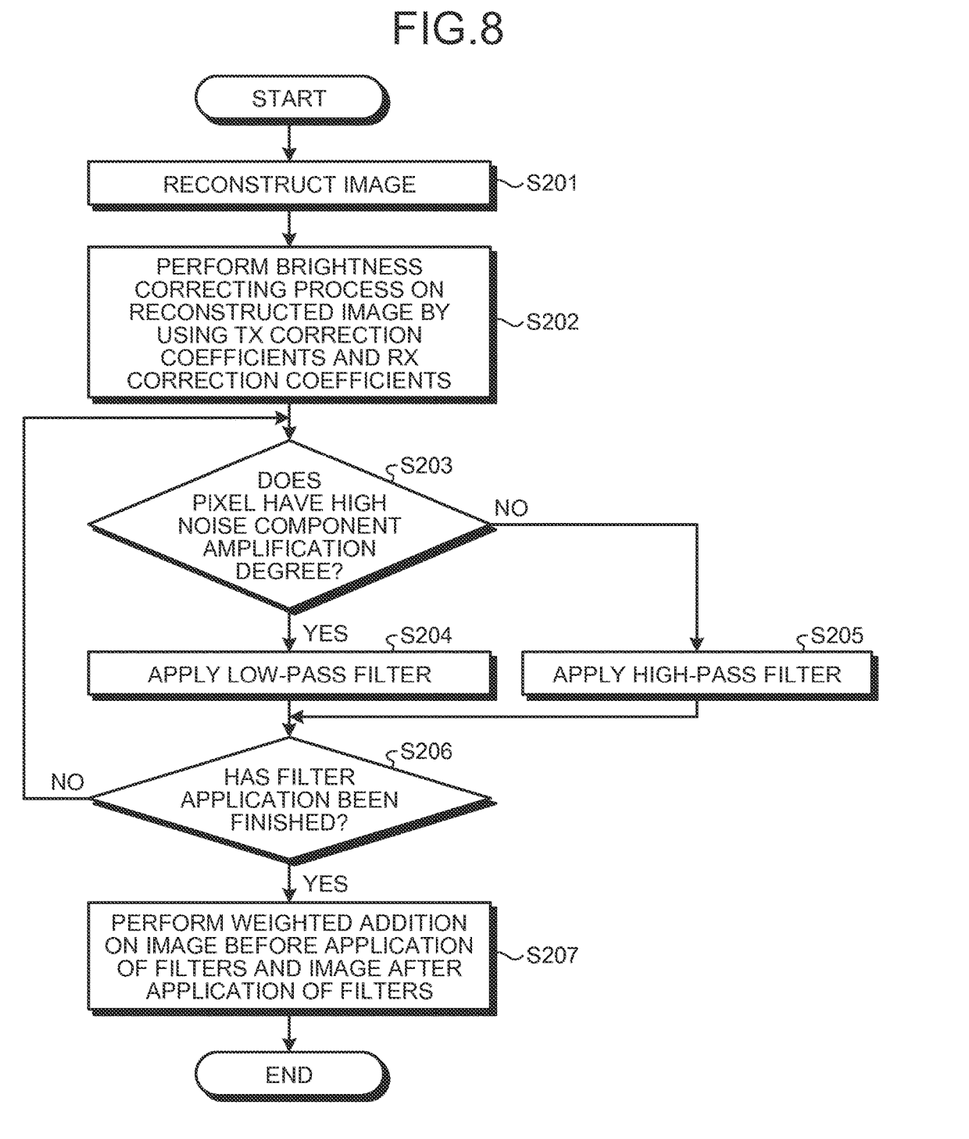
FIG. 8 is a flowchart of a processing procedure up to a process of applying filters according to the embodiment.

With regard to the processes performed by the functional units explained above, a flow of the processes will be explained in further details. FIG. 7 is a flowchart of a processing procedure up to the process of deriving the noise component amplification degrees according to the present embodiment. FIG. 8 is a flowchart of a processing procedure up to the process of applying the filters according to the present embodiment.

As shown in FIG. 7, in the controlling unit 26 according to the present embodiment, the sensitivity distribution measuring unit 26c at first measures a sensitivity distribution (step S101) and acquires a WBC-WBC sensitivity map and a WBC-AC sensitivity map. After that, the B1 magnetic field distribution estimating unit 26d estimates a B1 magnetic field distribution by arranging a B1 magnetic field distribution model so as to fit the WBC-WBC sensitivity map acquired at step S101 (step S102).

Subsequently, from the B1 magnetic field distribution estimated at step S102, the correction coefficient deriving unit 26e derives TX correction coefficients and also derives RX correction coefficients (step S103). Further, the noise component amplification degree deriving unit 26f derives noise component amplification degrees on the basis of the TX correction coefficients (step S104).

Further, as illustrated in FIG. 8, in the image reconstructing unit 22 according to the present embodiment, the reconstructing unit 22a at first reconstructs an image (step S201). Subsequently, the brightness correcting unit 22b performs a brightness correcting process on the reconstructed image by using the TX correction coefficients and the RX correction coefficients (step S202).

Subsequently, the filter applying unit 22c performs an adaptive filter calculation for each of the pixels contained in the brightness-corrected image, while using the noise component amplification degree. If the noise component amplification degree is high (step S203: Yes), the adaptive filter is a low-pass filter. Thus, the filter applying unit 22c applies the adaptive filter (i.e., the low-pass filter) to the pixel (step S204). On the contrary, if the noise component amplification degree is low (step S203: No), the adaptive filter is a high-pass filter. Thus, the filter applying unit 22c applies the adaptive filter (i.e., the high-pass filter) to the pixel (step S205).

Further, the filter applying unit 22c repeatedly performs the filter selecting process and the filter applying process on each of all the pixels contained in the image. When having finished the processes (step S206: Yes), the filter applying unit 22c performs a weighted addition on the image before the application of the filters and the image after the application of the filters (step S207), so as to obtain a final image.

The processing procedure is not limited to the example described above. It is acceptable to perform other similar processes. For example, it is acceptable to arbitrarily alter the order in which the processes are performed, e.g., the brightness correcting process may be performed after the filters are applied, or the filtering process described above may be performed during the brightness correcting process. Further, for example, it is acceptable to prepare in advance a plurality of types of filters including low-pass filters and high-pass filters and to select the filters as appropriate in accordance with the noise component amplification degrees.

As explained above, the MRI apparatus 100 according to the present embodiment is able to reduce the inhomogeneity in the brightness levels among the MR signals, by estimating the B1 magnetic field distribution on the basis of the sensitivity distribution, deriving the TX correction coefficients from the estimated B1 magnetic field distribution, further deriving the RX correction coefficients, and performing the brightness correcting processes while using each of the correction coefficients.

Further, the MRI apparatus 100 according to the present embodiment is configured to suppress the noise components in the regions where the noise component amplification degrees are high by applying the low-pass filters thereto and is configured to improve the sharpness in the regions where the noise component amplification degrees are low by applying the high-pass filters thereto. The MRI apparatus 100 is therefore able to improve the image quality and to appropriately reduce the impact of the inhomogeneity of the radio frequency magnetic field.

Possible embodiments are not limited to the exemplary embodiments described above.

Combining the Present Embodiment with Another Method Implemented at the MR Signal Acquiring Stage In the exemplary embodiments described above, the method is explained by which the impact of the inhomogeneity of the B1 magnetic field is reduced by performing the brightness correcting process and the filtering process on the reconstructed image. This method is implemented as an image processing process applied to the MR signals acquired by the sequence controlling unit 10. Incidentally, there are other methods by which the impact of the inhomogeneity of the B1 magnetic field is reduced at the MR signal acquiring stage. Examples of such methods include a method by which, for instance, MR signals are acquired while the phase and the amplitude of the RF pulse are adjusted in accordance with the image taking site and the image taking conditions such as the type of the RF coil. By implementing this method, it is possible to reduce, to a certain extent, the impact of the inhomogeneity of the B1 magnetic field on the MR signals themselves that are acquired by the sequence controlling unit 10.

In this regard, it is acceptable to implement the two methods in combination or only one of the two methods (i.e., the method implemented as the image processing process and the method implemented at the MR signal acquiring stage). When both of the two methods are implemented, for example, MR signals are acquired at first while the phase and the amplitude of the RF pulse are adjusted, and subsequently, the filtering process is performed during the image processing process applied to the MR signals. In that situation, the impact of the inhomogeneity of the B1 magnetic field is reduced to a certain extent at the acquiring stage also, and the impact of the inhomogeneity of the B1 magnetic field is further reduced during the subsequent image processing process. The method implemented at the MR signal acquiring stage may be a different method.

Using the Sensitivity Distribution in a Universal Manner

In the exemplary embodiments described above, the sensitivity distribution measuring unit 26c obtains the sensitivity distribution by performing the sensitivity map taking process. The sensitivity map taking process may be performed especially for the purpose of estimating the B1 magnetic field distribution and the like or may be performed in a universal manner so as to realize a sensitivity map taking process for other purposes as well.

For example, during an imaging process performed by implementing a parallel imaging (PI) method, a sensitivity distribution is used during an unfolding process to generate an image. For this reason, during the imaging process performed by implementing the PI method, a sensitivity distribution is obtained by performing a sensitivity map taking process at the stage of a preparatory scan or the like. Thus, in that situation, the sensitivity distribution measuring unit 26c may arrange the sensitivity distribution obtained for the purpose of performing the unfolding process and the sensitivity distribution obtained for the purpose of estimating the B1 magnetic field and the like to be used in a universal manner. In other words, during the imaging process performed by implementing the PI method, the reconstructing unit 22a generates an image by performing the unfolding process while using the sensitivity distribution obtained by the sensitivity distribution measuring unit 26c. Also, the B1 magnetic field distribution estimating unit 26d estimates a B1 magnetic field distribution by using the same sensitivity distribution.

According to at least one aspect of the magnetic resonance imaging apparatus and the magnetic resonance imaging method described in the exemplary embodiments above, it is possible to appropriately reduce the impact of the inhomogeneity of the radio frequency magnetic field.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising: a magnetic static field magnet configured to generate a magnetic static field in an imaging area, a gradient coil, one or more radiofrequency (RF) transmission coils configured to generate a B1 magnetic field in the imaging area, one or more RF receive coils, and at least one processor configured to:

obtain an estimated distribution of the B1 magnetic field with the magnetic resonance imaging apparatus;

derive with the at least one processor, on a basis of the estimated distribution of the B1 magnetic field, a transmission correction coefficient that corrects, in an MR image obtained from MR signals received by the one or more RF receive coils, a transmission unevenness that occurs due to a transmission of an RF pulse from the one or more RF transmission coils;

correct the MR image by applying the derived transmission correction coefficient to the MR image with the at least one processor;

derive with the at least one processor, for each of pixels in the corrected MR image an amplification degree by which noise components are amplified due to the correcting, on a basis of either the estimated distribution of the B1 magnetic field or the derived transmission correction coefficient;

apply with the at least one processor, a filtering onto each of the pixels in the corrected MR image according to the derived amplification degree of each of the respective pixels; and output a final MR image having reduced B1 inhomogeneity artifact(s) based on the filtering of the corrected MR image.

2. The magnetic resonance imaging apparatus according to claim 1, wherein the at least one processor is further configured to perform the filtering processes whereby the higher the amplification degree is, the higher is a tendency for low frequency bandwidths to be passed and whereby in such a manner that the lower the amplification degree is, the higher is a tendency for high frequency bandwidths to be passed.

3. The magnetic resonance imaging apparatus according to claim 1, wherein at least one processor is further configured to perform the filtering processes by changing weights applied to a plurality of filters in accordance with the amplification degrees of each of the pixels in the corrected MR image.

4. The magnetic resonance imaging apparatus according to claim 2, wherein the at least one processor is further configured to perform the filtering processes by changing weights applied to a plurality of filters in accordance with the amplification degrees of each of the pixels in the corrected MR image.

5. The magnetic resonance imaging apparatus according to claim 3, wherein the at least one processor is further configured to perform the filtering processes by employing an adaptive filter that uses a filter of which only a center component is set to a value of 1, and a smoothing filter while applying weights thereto, where the applied weights change in accordance with the amplification degrees of each of the pixels in the corrected MR image.

6. The magnetic resonance imaging apparatus according to claim 4, wherein the at least one processor is further configured to perform the filtering processes by employing an adaptive filter that uses a filter of which only a center component is set to a value of 1, and a smoothing filter while applying weights thereto, where the applied weights change in accordance with the amplification degrees of each of the pixels in the corrected MR image.

7. The magnetic resonance imaging apparatus according to claim 1, wherein the at least one processor is further configured to obtain the distribution of the radio frequency magnetic field by estimating the distribution of the radio frequency magnetic field on a basis of a sensitivity distribution of a Radio Frequency (RF) coil.

8. The magnetic resonance imaging apparatus according to claim 2, wherein the at least one processor is further configured to obtain the distribution of the radio frequency magnetic field by estimating the distribution of the radio frequency magnetic field on a basis of a sensitivity distribution of an RF coil.

9. The magnetic resonance imaging apparatus according to claim 3, wherein the at least one processor is further configured to obtain the distribution of the radio frequency magnetic field by estimating the distribution of the radio frequency magnetic field on a basis of a sensitivity distribution of an RF coil.

10. The magnetic resonance imaging apparatus according to claim 7, wherein the at least one processor is further configured to: reconstruct an image from magnetic resonance signal data acquired by implementing a parallel imaging method, wherein the sensitivity distribution that is used in estimating the distribution of the radio frequency magnetic field is also used as a sensitivity distribution in an unfolding process.

11. The magnetic resonance imaging apparatus according to claim 7, wherein the at least one processor is further configured to: reconstruct an image from magnetic resonance signal data; and perform a brightness correcting process on the reconstructed image, wherein, the sensitivity distribution that is used in estimating the distribution of the radio frequency magnetic field is also used as a sensitivity distribution in the brightness correcting process.

12. The magnetic resonance imaging apparatus according to claim 1, further comprising:
   a sequence controller configured to acquire Magnetic Resonance (MR) signals, wherein the sequence controller acquires the MR signals while making an adjustment to the transmitted RF pulse in order to reduce an impact of inhomogeneity of the radio frequency magnetic field.

13. The magnetic resonance imaging apparatus according to claim 2, further comprising:
   a sequence controller configured to acquire MR signals, wherein the sequence controller acquires the MR signals while making an adjustment to the transmitted RF pulse in order to reduce an impact of inhomogeneity of the radio frequency magnetic field.

14. The magnetic resonance imaging apparatus according to claim 3, further comprising:
   a sequence controller configured to acquire MR signals, wherein the sequence controller acquires the MR signals while making an adjustment to the transmitted RF pulse in order to reduce an impact of inhomogeneity of the radio frequency magnetic field.

15. A magnetic resonance imaging method implemented by a magnetic resonance imaging apparatus having a magnetostatic field magnet configured to generate a magnetostatic field in an imaging area, a gradient coil, one or more radio frequency (RF) transmit coils configured to generate a B1 magnetic field in the imaging area, one or more RF receive coils, and at least one processor, the magnetic resonance imaging method comprising:
   obtaining an estimated distribution of the B1 magnetic field with the magnetic resonance imaging apparatus;
   deriving, on a basis of the estimated distribution of the B1 magnetic field, a transmission correction coefficient that corrects, in an MR image obtained from MR signals received by the one or more RF receive coils, a transmission unevenness that occurs due to a transmission of an RF pulse;
   correcting the MR image by applying the derived transmission correction coefficient to the MR image with the at least one processor;
   deriving with the at least one processor, for each of the MR image pixels, an amplification degree by which noise components are amplified in the MR image due to the correction, on a basis of either the estimated distribution of the B1 magnetic field or the transmission correction coefficient; and
   performing with the at least one processor, a filtering process on each of the pixels in the corrected MR image according to the derived amplification degree of each of the pixels in the MR image to which the correction is respectively applied, whereby a B1 inhomogeneity artifact is reduced in a final MR image.

* * * * *